United States Patent
Wu et al.

(10) Patent No.: US 12,133,478 B2
(45) Date of Patent: Oct. 29, 2024

(54) MEMRISTOR AND PREPARATION METHOD THEREOF

(71) Applicant: TSINGHUA UNIVERSITY, Beijing (CN)

(72) Inventors: Huaqiang Wu, Beijing (CN); He Qian, Beijing (CN); Xinyi Li, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 541 days.

(21) Appl. No.: 17/477,119

(22) Filed: Sep. 16, 2021

(65) Prior Publication Data
US 2022/0093855 A1    Mar. 24, 2022

(30) Foreign Application Priority Data

Sep. 22, 2020 (CN) .......................... 202011001124.3

(51) Int. Cl.
*H10N 70/00* (2023.01)
*H10B 63/00* (2023.01)
*H10N 70/20* (2023.01)

(52) U.S. Cl.
CPC .......... *H10N 70/801* (2023.02); *H10B 63/30* (2023.02); *H10N 70/011* (2023.02); *H10N 70/24* (2023.02); *H10N 70/841* (2023.02); *H10N 70/8833* (2023.02)

(58) Field of Classification Search
CPC .......................... H10N 708/801; H10N 63/30
See application file for complete search history.

(56) References Cited

FOREIGN PATENT DOCUMENTS

WO    WO-2022032582 A1 *  2/2022

\* cited by examiner

*Primary Examiner* — Marvin Payen
(74) *Attorney, Agent, or Firm* — Loeb & Loeb LLP (57) ABSTRACT

A memristor and a preparation method thereof are provided. The memristor includes at least one memristive unit, each of the at least one memristive unit includes a transistor and at least one memristive component, the transistor includes a source electrode and a drain electrode; and each of the at least one memristive component includes a first electrode, a resistive layer, a second electrode, and a passivation layer, the first electrode is electrically connected with the source electrode or the drain electrode; the resistive layer is provided between the first electrode and the second electrode; and the passivation layer at least covers a sidewall of the resistive layer.

15 Claims, 7 Drawing Sheets

MEMRISTOR AND PREPARATION METHOD THEREOF

CROSS-REFERENCE TO RELATED APPLICATION

This application claims priority to Chinese application number 202011001124.3 filed on Sep. 22, 2020, whose disclosure is incorporated by reference in its entirety herein.

TECHNICAL FIELD

Embodiments of the present disclosure relate to a memristor and a preparation method thereof.

BACKGROUND

A memory resistor (memristor for short) is a circuit device that indicates a relationship between magnetic flux and electric charge. The memristor has a measurement unit of resistance, but unlike a resistor, a resistance value of the memristor is determined by charges flowing therethrough. Therefore, by measuring the resistance value of the memristor, an amount of charges flowing through the memristor can be known, such that the memristor has a function of memorizing charges. In addition, the memristor also has advantages of simple structure and low power consumption, and thus has attracted more and more attention from academia and industry.

SUMMARY

At least one embodiment of the present disclosure provides a memristor, the memristor comprises at least one memristive unit, each of the at least one memristive unit comprises a transistor and at least one memristive component, the transistor comprises a source electrode and a drain electrode; each of the at least one memristive component comprises a first electrode, a resistive layer, a second electrode, and a passivation layer, the first electrode is electrically connected with the source electrode or the drain electrode; the resistive layer is provided between the first electrode and the second electrode; and the passivation layer at least covers a sidewall of the resistive layer.

For example, in the memristor provided by at least one embodiment of the present disclosure, a dielectric constant of the passivation layer is k, and k≤10.

For example, in the memristor provided by at least one embodiment of the present disclosure, a material of the passivation layer comprises at least one of SiNx, SiCN, AlN, BN, and TaN.

For example, in the memristor provided by at least one embodiment of the present disclosure, a thickness of the passivation layer ranges from 10 nm to 100 nm.

For example, in the memristor provided by at least one embodiment of the present disclosure, each of the at least one memristive component further comprises a capping layer, the capping layer is provided between the resistive layer and the second electrode, and a material of the capping layer comprises metal or metal oxide.

For example, in the memristor provided by at least one embodiment of the present disclosure, the metal comprises at least one of Ti, Hf, and Ta, and the metal oxide comprises at least one of TaOx, AlOx, and SiOx.

For example, the memristor provided by at least one embodiment of the present disclosure further comprises an insulating layer, the insulating layer covers the at least one memristive unit, and a thickness of the insulating layer ranges from 100 nm to 1000 nm.

For example, the memristor provided by at least one embodiment of the present disclosure further comprises a wiring layer, the wiring layer is provided on a side of the insulating layer away from the at least one memristive unit, the insulating layer has a first through hole exposing the second electrode, and the wiring layer is electrically connected with the second electrode through the first through hole.

For example, the memristor provided by at least one embodiment of the present disclosure further comprises a protective passivation layer, the protective passivation layer is provided on a side of the wiring layer away from the insulating layer, and the protective passivation layer has a second through hole exposing the wiring layer to form an interface.

For example, in the memristor provided by at least one embodiment of the present disclosure, the at least one memristive unit comprises a plurality of memristive units, and the plurality of memristive units are arranged in an array.

For example, in the memristor provided by at least one embodiment of the present disclosure, a material of the first electrode comprises at least one of TiN, W, Pt and Pd, and a thickness of the first electrode ranges from 10 nm to 100 nm, a material of the resistive layer comprises at least one of HfOx. TaOx and TiOx, and a thickness of the resistive layer ranges from 2 nm to 100 nm, and a material of the second electrode comprises at least one of TiN, Ti, Al and W, and a thickness of the second electrode ranges from 10 nm to 100 nm.

At least one embodiment of the present disclosure further provides a preparation method of a memristor, which comprises: forming at least one memristive unit, in which each of the at least one memristive unit comprises: a transistor, comprising a source electrode and a drain electrode; and at least one memristive component, in which forming each of the at least one memristive component comprises: forming a first electrode, in which the first electrode is electrically connected with the source electrode or the drain electrode; forming a second electrode; forming a resistive layer between the first electrode and the second electrode; and forming a passivation layer, in which the passivation layer at least covers a sidewall of the resistive layer.

For example, in the preparation method of a memristor provided by at least one embodiment of the present disclosure, forming at least one memristor component comprises: sequentially forming a first electrode material layer, a resistive material layer and a second electrode material layer on the transistor; patterning the first electrode material layer, the resistive material layer and the second electrode material layer to form the first electrode, the resistive layer and the second electrode of the at least one memristor component; forming a passivation material layer on the transistor formed with the at least one memristor component; and patterning the passivation material layer to form the passivation layer, wherein the passivation layer at least has a first through hole exposing the second electrode.

For example, the preparation method of a memristor provided by at least one embodiment of the present disclosure further comprises forming an insulating layer, the insulating layer covers the at least one memristive unit, and forming at least one memristor component comprises: sequentially forming a first electrode material layer, a resistive material layer and a second electrode material layer on the transistor; patterning the first electrode material layer, the resistive material layer and the second electrode material layer to form the first electrode, the resistive layer and the second electrode of the at least one memristor component; forming a passivation material layer and an insulating material layer on the transistor formed with the at least one memristor component; and patterning the passivation material layer and the insulating material layer to form the passivation layer and the insulating layer, wherein the passivation layer and the insulating layer have a first through hole exposing the second electrode.

For example, the preparation method of a memristor provided by at least one embodiment of the present disclosure further comprises forming a wiring layer on a side of the insulating layer away from the at least one memristive unit, and forming the wiring layer comprises: forming a wiring material layer on the side of the insulating layer away from the at least one memristive unit, and patterning the wiring material layer to form the wiring layer, wherein the wiring layer is electrically connected with the second electrode through the first through hole.

For example, the preparation method of a memristor provided by at least one embodiment of the present disclosure further comprises forming a protective passivation layer on a side of the wiring layer away from the insulating layer, and forming the protective passivation layer comprises: forming a protective passivation material layer on the side of the wiring layer away from the insulating layer, and patterning the protective passivation material layer to form the protective passivation layer, in which the protective passivation layer has a second through hole exposing the wiring layer to form an interface.

BRIEF DESCRIPTION OF THE DRAWINGS

In order to illustrate the technical solutions of the embodiments of the present disclosure more clearly, the drawings of the embodiments of the present disclosure will be briefly introduced below. Apparently, the drawings described below only refer to some embodiments of the present disclosure, and do not limit the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

Exemplarily, a resistive layer of a memristor is surrounded by a dielectric material/insulating material. In a preparation process, a through hole can be formed in a dielectric layer/insulating layer made of the dielectric material/insulating material, and then a resistive material is filled in the through hole to form the resistive layer, and a shape and size of the resistive layer are defined by a shape and size of the through hole. In this case, the resistive layer is surrounded by the dielectric material/insulating material, and the resistive layer is in contact with the dielectric material/insulating material.

Inventors of the present disclosure find that, in the above memristor, ions in the memristor move when driven by an electric field and a thermal field, and redistribution of ions in the resistive layer will be affected by the dielectric layer/insulating layer that forms the through hole, for example, the ions in the resistive layer may spread into the dielectric layer/insulating layer, or ions in the dielectric layer/insulating layer may spread into the resistive layer. As a size of the device decreases, such an ion inter-diffusion effect will more severely affect the performance of the memristor.

At least one embodiment of the present disclosure provides a memristor and a preparation method thereof. The memristor includes at least one memristive unit, and each of the at least one memristive unit includes a transistor and at least one memristive component; the transistor includes a source electrode and a drain electrode; each of the at least one memristive component includes a first electrode, a resistive layer, a second electrode, and a passivation layer; the first electrode is electrically connected with the source electrode or the drain electrode; the resistive layer is between the first electrode and the second electrode; and the passivation layer at least covers a sidewall of the resistive layer. The passivation layer can avoid a problem of inter-diffusion of ions between the resistive layer and the adjacent dielectric layer or insulating layer, and can prevent heat generated by the memristive component during a resistive process from diffusing outwards. In addition, in the case where the memristor includes a plurality of memristive units, the passivation layer can also avoid occurrence of crosstalk during operation of the memristive units to adversely affect overall performance of the memristor, such that the memristor has long-term stability, and its performance will not degrade over time.

Hereinafter, the memristor and the preparation method thereof provided by the embodiments of the present disclosure will be described through several specific embodiments in conjunction with the accompanying drawings.

Figure 1:
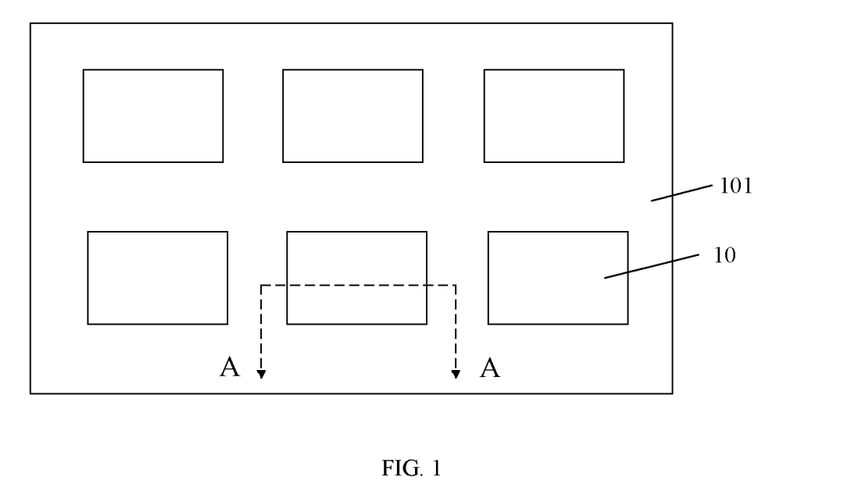
FIG. 1 is a schematic plan view of a memristor provided by at least one embodiment of the present disclosure.

At least one embodiment of the present disclosure provides a memristor. FIG. 1 shows a schematic plan view of the memristor, and FIG. 2 shows a schematic cross-sectional view of the memristor in FIG. 1 along a line A-A.

As shown in FIG. 1, the memristor includes at least one memristive unit 10, for example, a plurality of memristive units 10. In some embodiments, the plurality of memristive units 10 may be arranged in an array. FIG. 1 shows six memristive units 10 as an example, but the embodiments of the present disclosure do not limit the number of memristive units 10. In other embodiments, the number of memristive units 10 may also be, for example, two, three, or four.

Figure 2:
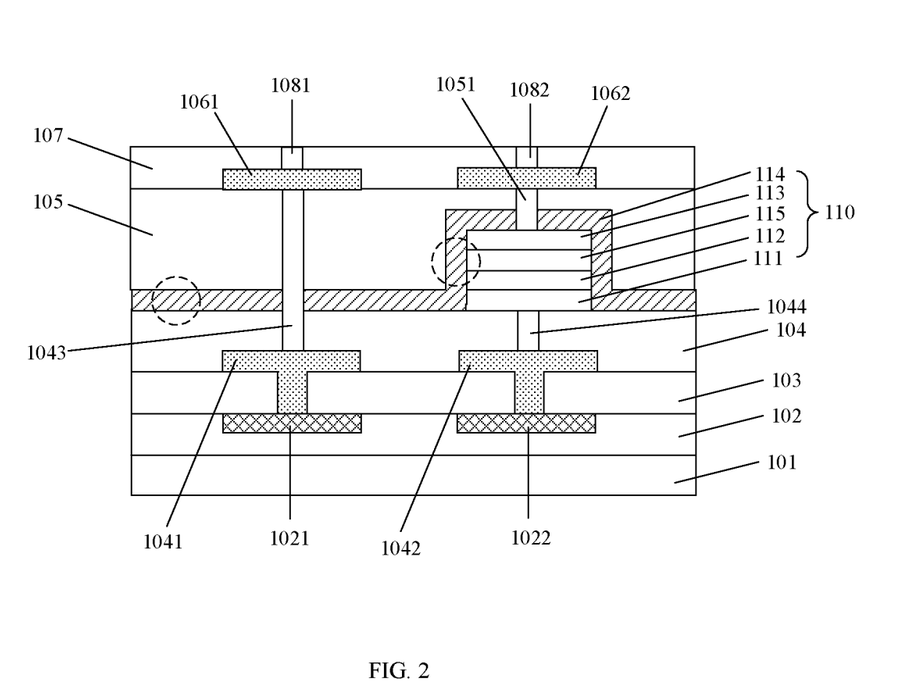
FIG. 2 is a schematic cross-sectional view of the memristor in FIG. 1 along a line A-A.

As shown in FIG. 2, each memristive unit 10 includes a transistor and at least one memristive component, that is, each memristive unit 10 includes a transistor and one or more memristive components electrically connected with the transistor. FIG. 2 shows one memristive component 110 as an example. In other embodiments, each memristive unit 10 may also include a transistor and two, three, or four memristive components electrically connected with the transistor.

As shown in FIG. 2, the transistor includes a source electrode 1021 and a drain electrode 1022. Of course, the transistor may also include structures such as a gate electrode, and an active layer, which are not shown in the drawing; for example, a gate insulating layer is disposed between the active layer and the gate electrode, and when a voltage is applied to the gate electrode, a channel is formed in the active layer to connect the source electrode and the drain electrode. For these structures, conventional designs can be referred to, which are not specially limited in the embodiments of the present disclosure.

For example, a layer 102 where the transistor is located is a CMOS (Complementary Metal Oxide Semiconductor) circuit layer, and the CMOS circuit layer may include a stack of multiple metal layers and insulating layers to form corresponding components such as circuit patterns, transistors and the like. For example, when the memristor includes a plurality of memristive units 10, the CMOS circuit layer may include a plurality of transistors, the plurality of transistors may be any type of transistors such as thin film transistors, and structures of the plurality of transistors may be same or different. The embodiments of the present disclosure do not limit the specific form of the CMOS circuit layer.

As shown in FIG. 2, each memristive component 110 includes a first electrode 111, a resistive layer 112, a second electrode 113 and a passivation layer 114. The first electrode 111 is electrically connected with the source electrode 1021 or the drain electrode 1022 (it is shown in the drawing that the first electrode 111 is electrically connected with the drain electrode 1022 through a circuit pattern 1042; alternatively, the first electrode 111 may also be directly connected with the source electrode 1021 or the drain electrode 1022), the resistive layer 112 is disposed between the first electrode 111 and the second electrode 113, and the passivation layer 114 at least covers a sidewall of the resistive layer 112, for example, the passivation layer 114 is disposed around the sidewall of the resistive layer 112.

Here, it should be noted that the sidewall of the resistive layer refers to a surface of the resistive layer except for surfaces in direct contact with an upper structural layer (e.g., the second electrode 113 or a capping layer 115) and a lower structural layer (e.g., the first electrode 111), for example, refers to a sidewall in a direction perpendicular to a surface of a substrate 101 in the drawing.

Therefore, the passivation layer at least separates the resistive layer 112 from the adjacent insulating layer 105 (described in detail later) to avoid the problem of inter-diffusion of ions between the resistive layer 112 and the insulating layer 105, and to prevent heat generated by the memristive component during a resistive process from diffusing outwards. In addition, when the memristor includes a plurality of memristive units 10, the passivation layer can also avoid occurrence of crosstalk during operation of the plurality of memristive units 10 to adversely affect overall performance of the memristor, such that the accuracy of the memristor is improved, the memristor has long-term stability, and its performance will not degrade over time.

Figure 3:
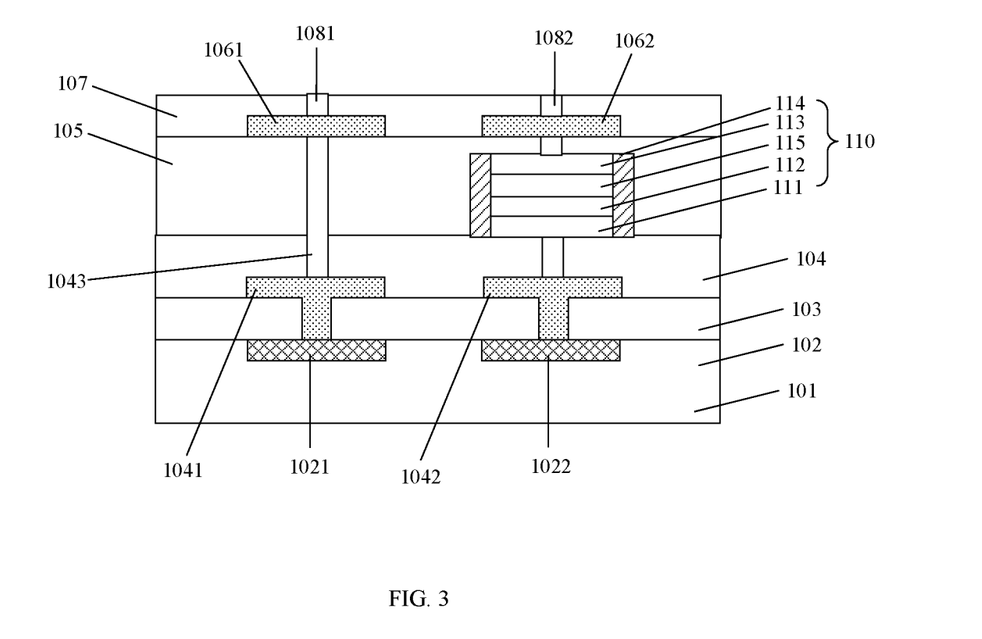
FIG. 3 is another schematic cross-sectional view of the memristor in FIG. 1 along the line A-A.
Figure 4:
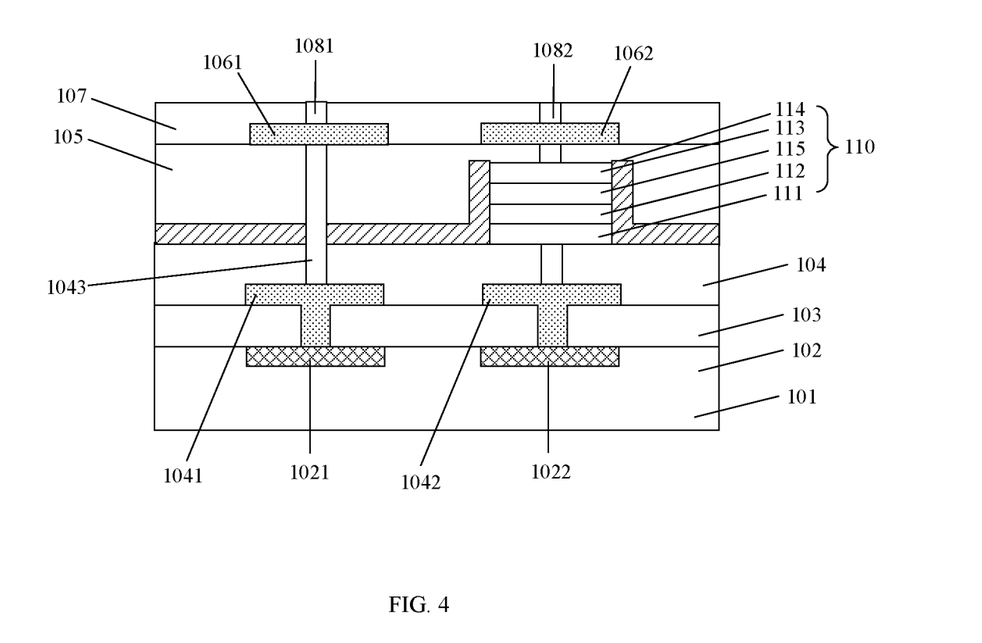
FIG. 4 is still another schematic cross-sectional view of the memristor in FIG. 1 along the line A-A.

For example, in some embodiments, as shown in FIG. 2, the passivation layer 114 may not only be formed on the sidewall of the resistive layer 112, but may also be formed to cover a sidewall of the first electrode 111 and a sidewall of the second electrode 113, and is formed integrally to further cover part of a top surface of the second electrode 113 and an upper surface of an insulating layer 104; in other embodiments, the passivation layer 114 may be formed only on the sidewall of the resistive layer 112; or, as shown in FIG. 3, the passivation layer 114 may be formed on a sidewall of the stack of the first electrode 111, the resistive layer 112, and the second electrode 113; or, as shown in FIG. 4, the passivation layer 114 may be formed on the sidewall of the stack of the first electrode 111, the resistive layer 112, and the second electrode 113 and on the upper surface of the insulating layer 104, and expose an entire top surface of the second electrode 113. The embodiments of the present disclosure do not specifically limit a position where the passivation layer 114 is located, as long as ion diffusion between the resistive layer 112 and the insulating layer 105 can be prevented.

For example, in some embodiments, the passivation layer 114 adopts a low-k material, for example, a dielectric constant of the passivation layer 114 is k, and k≤10, for example, k≤5, or k≤2.8. Thus, it is avoided to use the passivation layer 114 as a dielectric layer to form a large parasitic capacitance in the memristor, so as to avoid adverse impact on the overall performance of the memristor.

For example, in some embodiments, a material of the passivation layer 114 may include at least one of $SiN_x$, SiCN, AlN, BN, and TaN. These materials all have low dielectric constants, and such materials are resistant to high temperatures, have stable chemical properties, and can effectively avoid inter-diffusion of ions between the resistive layer 112 and the insulating layer 105, for example, avoid oxygen diffusion between the resistive layer 112 and the insulating layer 105.

For example, in some embodiments, a thickness of the passivation layer 114 may range from 10 nm to 100 nm, such as 20 nm, 30 nm, 50 nm, or 70 nm. The passivation layer 114 with this thickness can effectively avoid the problem of inter-diffusion of ions between the resistive layer 112 and the insulating layer 105.

It should be noted that, in the embodiments of the present disclosure, the thickness of the passivation layer 114 refers to a size of the passivation layer 114 in a direction perpendicular to the surface on which it is located. For example, in FIG. 2, a thickness of part of the passivation layer formed on a horizontal surface (for example, part of the passivation layer circled by a dashed line on the left in FIG. 2) refers to a size of this part of the passivation layer in a vertical direction, and a thickness of part of the passivation layer formed on a vertical surface (for example, part of the passivation layer formed on the sidewall of the resistive layer 112 circled by a dashed line on the right in FIG. 2) refers to a size of the part of the passivation layer in a horizontal direction.

For example, in some embodiments, a material of the first electrode 111 may include at least one of TiN, W, Pt, and Pd, and a thickness of the first electrode 111 (that is, a size of the first electrode 111 in the vertical direction in the drawing) may range from 10 nm to 100 nm, such as 30 nm, 40 nm, 50 nm or 70 nm. A material of the resistive layer 112 may include at least one of HfOx, TaOx, and TiOx, and a thickness of the resistive layer 112 (that is, a size of the resistive layer 112 in the vertical direction in the drawing) may range from 2 nm to 100 nm, such as 5 nm, 10 nm, 30 nm, 50 nm or 70 nm. A material of the second electrode 113 may include at least one of TiN, Ti, Al, and W, and a thickness of the second electrode 113 (that is, a size of the second electrode 113 in the vertical direction in the drawing) may range from 10 nm to 100 nm, such as 20 nm, 40 nm, 70 nm or 80 nm.

For example, in some embodiments, as shown in FIG. 2, each memristive component 10 may further include a capping layer 115, and the capping layer 115 is disposed between the resistive layer 112 and the second electrode 113. A material of the capping layer 115 may include metal or metal oxide. The arrangement of the capping layer 115 can allow the performance of the memristive component 10 to be more stable.

For example, the metal forming the capping layer 115 may include at least one of Ti, Hf, and Ta, and the metal oxide forming the capping layer 115 may include at least one of TaOx, AlOx, and SiOx. For example, a thickness of the capping layer 115 (that is, a size of the capping layer 115 in the vertical direction in the drawing) may range from 2 nm to 100 nm, such as 20 nm, 50 nm, 70 nm, or 80 nm.

For example, as shown in FIG. 2, the memristor may further include an insulating layer 105, the insulating layer 105 covers at least one memristive unit 10, and a thickness of the insulating layer 105 may range from 100 nm to 1000 nm, such as 300 nm, 500 nm, or 700 nm, so as to planarize and protect the at least one memristive unit 10. For example, a material of the insulating layer 105 may be an insulating material such as silicon oxide ($SiO_2$).

For example, as shown in FIG. 2, the memristor may further include a wiring layer, the wiring layer is disposed on a side of the insulating layer 105 away from the at least one memristive unit 10, the insulating layer 105 has a first through hole 1051 exposing the second electrode 115, and the wiring layer is electrically connected with the second electrode 113 through the first through hole 1051.

For example, the wiring layer may include a first wiring pattern 1061 and a second wiring pattern 1062, the first wiring pattern 1061 is electrically connected with the source electrode 1021 of the transistor through a conductive structure 1043 and a circuit pattern 1041, and the second wiring pattern 1062 is electrically connected with the second electrode 113 through a conductive structure formed in the first through hole 1051. In addition, the first electrode 111 of the resistive element 110 is electrically connected with the circuit pattern 1042 through a conductive structure 1044, and therefore is electrically connected with the drain electrode 1022.

For example, the circuit pattern 1041 and the circuit pattern 1042 may be part of patterns of a driving circuit, for example, may include a stack of multiple wiring layers and insulating layers, which is not specifically limited in the embodiments of the present disclosure.

As shown in FIG. 2, an insulating layer 104 is formed on a side of the circuit pattern 1041 and the circuit pattern 1042 away from the substrate 101, the insulating layer 104 has through holes exposing the circuit pattern 1041 and the circuit pattern 1042, and the conductive structures 1043 and 1044 are formed in the through holes. An insulating layer 103 is formed on a side of the circuit pattern 1041 and the circuit pattern 1042 close to the substrate 101, the insulating layer 103 has through holes exposing the source electrode and the drain electrode, and the circuit pattern 1041 and the circuit pattern 1042 are electrically connected with the source electrode 1021 and the drain electrode 1022 through the through holes, respectively.

For example, the wiring layer may include a metal material such as copper (Cu), aluminum (Al), and silver (Al), or an alloy material thereof. The circuit pattern 1041 and the circuit pattern 1042 may include a metal material such as copper (Cu), aluminum (Al), and silver (Al), or an alloy material thereof. Each conductive structure may include a metal material such as tungsten (W). The insulating layer 103 and the insulating layer 104 may include an insulating material such as silicon oxide ($SiO_2$). The embodiments of the present disclosure do not specifically limit the material of each functional layer.

For example, as shown in FIG. 2, the memristor may further include a protective passivation layer 107. The protective passivation layer 107 is disposed on a side of the wiring layer away from the insulating layer 105, and the protective passivation layer 107 has second through holes 1081 and 1082 exposing the wiring layer, and the second through holes 1081 and 1082 are used to form interfaces, so that the memristor can be electrically connected with an external circuit through the interfaces.

For example, a material of the protective passivation layer 107 may include an insulating material such as silicon oxide and silicon nitride, and a thickness of the protective passivation layer 107 may range from 50 nm to 2000 nm, such as 100 nm, 500 nm, or the like.

A preparation process of the above memristor provided by the embodiments of the present disclosure can be compatible with a preparation process of the CMOS circuit, thus facilitating the preparation of the memristor.

At least one embodiment of the present disclosure further provides a preparation method of a memristor, and the preparation method includes: forming at least one memristive unit, in which each of the at least one memristive unit includes a transistor and at least one memristive component, and the transistor includes a source electrode and a drain electrode, forming each of the at least one memristive component includes: forming a first electrode, the first electrode being electrically connected with the source electrode or the drain electrode; forming a second electrode; forming a resistive layer between the first electrode and the second electrode; and forming a passivation layer, the passivation layer at least covering a sidewall of the resistive layer.

Hereinafter, in conjunction with FIGS. 5A to 5I, and taking the memristor shown in FIG. 2 as an example, the preparation method of the memristor provided by the embodiments of the present disclosure will be described in detail.

Figure 5A:
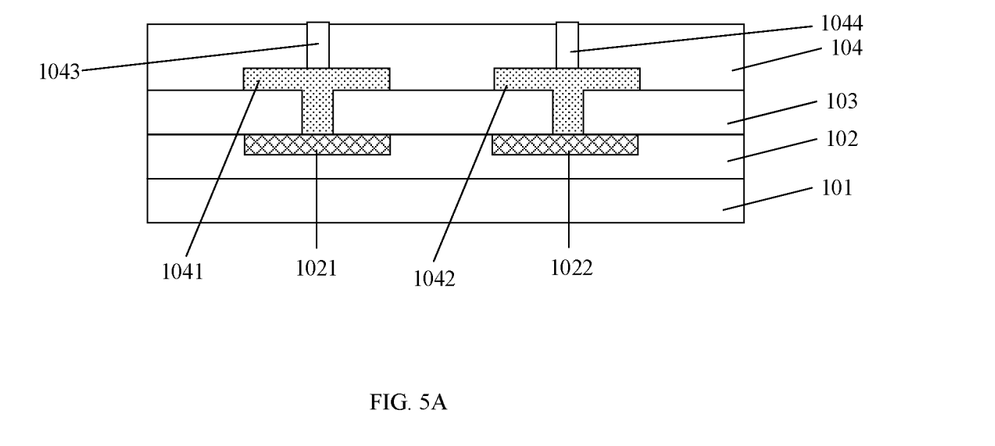
FIGS. 5A-5I are schematic cross-sectional views of a memristor provided by at least one embodiment of the present disclosure during a preparation process.

As shown in FIG. 5A, firstly, a substrate 101 having a CMOS circuit layer 102 is provided, for example, a silicon substrate having the CMOS circuit layer 102 or the like is provided. The substrate 101 with the CMOS circuit layer 102 can be purchased directly or self-made. When the CMOS circuit layer 102 is self-made, each functional layer of the CMOS circuit layer 102 needs to be formed on the substrate 101 by, for example, a patterning process. For this formation method, reference may be made to related technologies, which are not specifically limited in the embodiments of the present disclosure.

For example, an insulating layer 103 is formed on the CMOS circuit layer 102, through holes exposing the source electrode 1021 and the drain electrode 1022 of the transistor are formed in the insulating layer 103 by a patterning process, and then a circuit material layer is formed on the insulating layer 103 by means of, for example, sputtering. The circuit material layer fills the through holes of the insulating layer 103, and then the circuit material layer is subjected to a patterning process to form circuit patterns 1041 and 1042. In this case, the circuit patterns 1041 and 1042 are electrically connected with the source electrode 1021 and the drain electrode 1022 through the through holes, respectively.

For example, in some embodiments, when the circuit patterns 1041 and 1042 include a stack of multiple metal layers and insulating layers, multiple patterning processes may be performed to form the circuit patterns 1041 and 1042.

It should be noted that, in the embodiments of the present disclosure, a single patterning process may include photoresist formation, exposure, development, etching, and the like. For these processing steps, reference may be made to related technologies, which are not specifically limited in the embodiments of the present disclosure.

Then, an insulating layer 104 is formed on the circuit patterns 1041 and 1042 by a process such as coating or deposition, and through holes exposing the circuit patterns 1041 and 1042 are formed in the insulating layer 104 by a patterning process, and then a conductive material, for example, tungsten is filled in the through holes, to form part of the conductive structure 1043 and the conductive structure 1044.

Then, at least one memristive component is formed on the insulating layer 104.

Figure 5B:
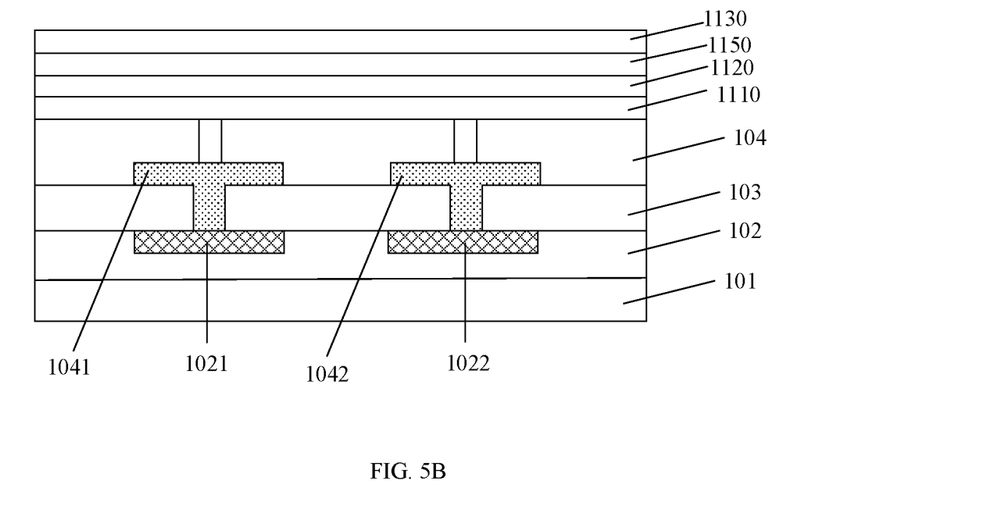
Figure 5C:
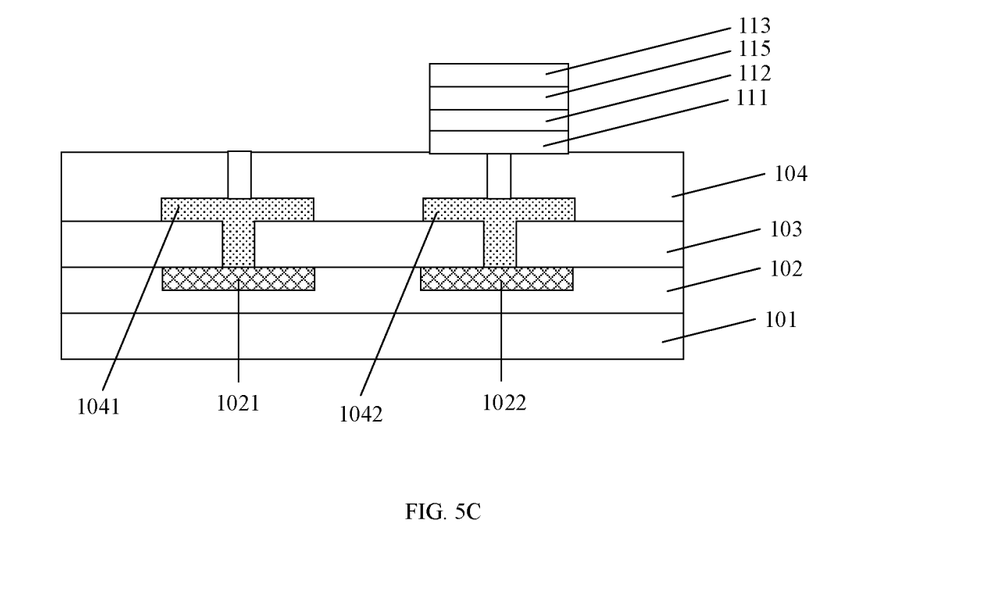

As shown in FIG. 5B, a first electrode material layer 1110, a resistive material layer 1120, and a second electrode material layer 1130 are sequentially formed on the insulating layer 104 above the transistor by using a deposition method such as physical vapor deposition (PVD) or atomic layer deposition (ALD), and then the first electrode material layer 1110, the resistive material layer 1120, and the second electrode material layer 1130 are subjected to a patterning process, to form a first electrode 111, a resistive layer 112 and a second electrode 113 of the at least one memristive component, i.e., to form an "island" of the memristive component as shown in FIG. 5C.

For example, when the memristor includes a plurality of memristive components, the first electrodes 111, the resistive layers 112, and the second electrodes 113 of the plurality of memristive components can be formed simultaneously by the same patterning process.

For example, the first electrode material layer 110 may include at least one of TiN, W, Pt, and Pd, and a forming thickness of the first electrode material layer 110 may be 10 nm-100 nm, such as 40 nm, 50 nm, or 70 nm. The resistive material layer 1120 may include at least one of HfOx, TaOx, and TiOx, and a forming thickness of the resistive material layer 1120 may be 2 nm-100 nm, such as 5 nm, 10 nm, 30 nm, 50 nm, or 70 nm. A material of the second electrode material layer 1130 may include at least one of TiN, Ti, Al, and W, and a forming thickness of the second electrode material layer 1130 may be 10 nm-100 nm, such as 20 nm, 50 nm, 70 nm, or 80 nm.

Similarly, when the memristive component further includes a capping layer 115, a capping material layer 1150 is further deposited between the resistive material layer 1120 and the second electrode material layer 1130. In this case, a first electrode material layer 1110, a resistive material layer 1120, a capping material layer 1150, and a second electrode material layer 1130 need to be formed sequentially on the insulating layer 104, and then the first electrode material layer 1110, the resistive material layer 1120, the capping material layer 1150, and the second electrode material layer 1130 are subjected to a patterning process to form a stack of the first electrode 111, the resistive layer 112, the capping layer 115, and the second electrode 113 of at least one memristive component, as shown in FIG. 5C.

For example, a forming thickness of the capping layer 115 is 2 nm-100 nm, such as 20 nm, 50 nm, 70 nm, or 80 nm.

Figure 5D:
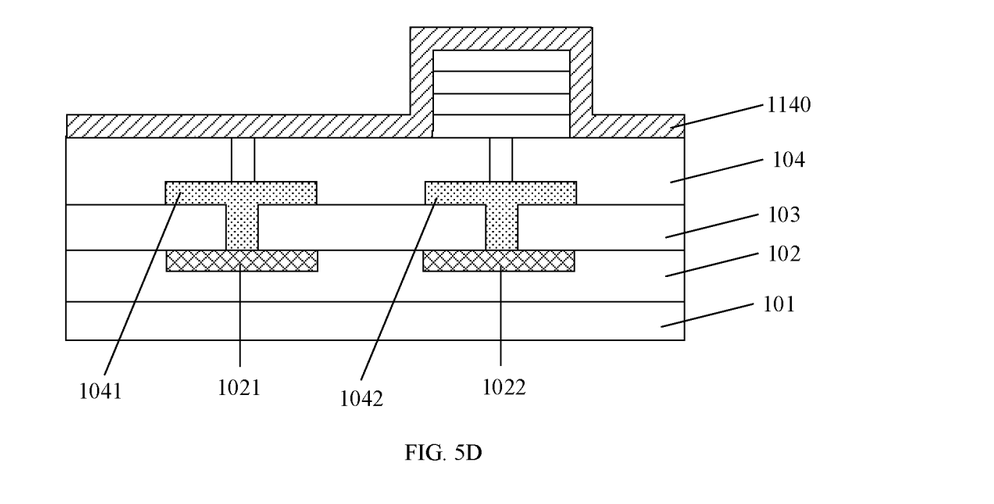
Figure 5E:
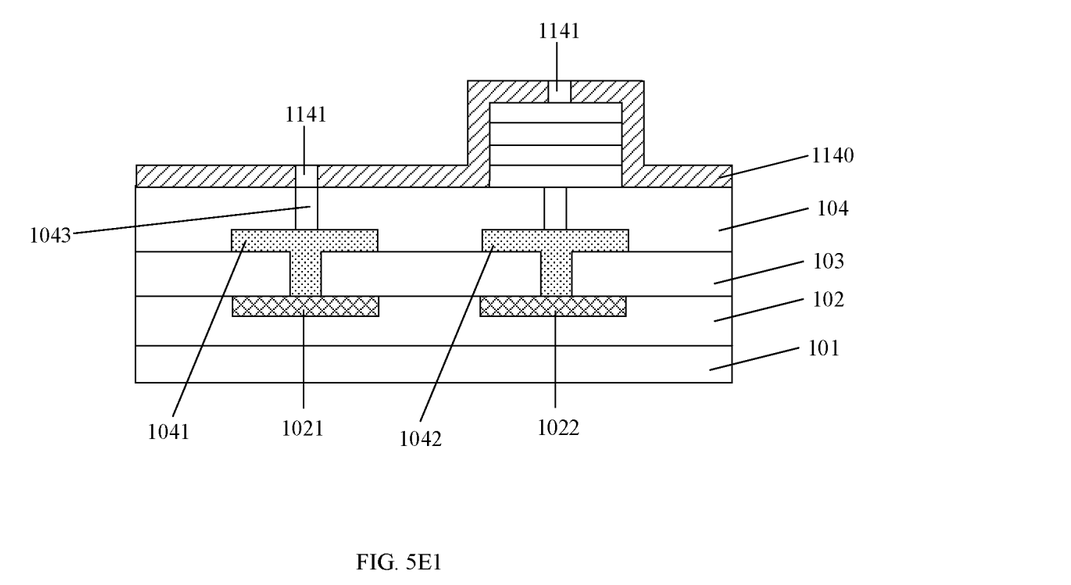

As shown in FIG. 5D, a passivation material layer 1140 may be formed on the substrate formed with the at least one memristive component by using a deposition method such as chemical vapor deposition (for example, plasma enhanced chemical vapor deposition (PECVD)), and then the passivation material layer 1140 is patterned to form a passivation layer 114. In this case, as shown in FIG. 5E1, the passivation layer 114 at least has through holes 1141 exposing the second electrode 113 and the conductive structure 1043.

Alternatively, the passivation material layer 1140 may also be patterned to form the structure shown in FIG. 3, and the patterned 114 may be formed on a sidewall of the stack of the first electrode 111, the resistive layer 112, and the second electrode 113; or, the passivation material layer 1140 may also be patterned to form the structure shown in FIG. 4, the passivation layer 114 may be formed on a sidewall of the stack of the first electrode 111, the resistive layer 112, and the second electrode 113, and on an upper surface of the insulating layer 104, and expose an entire top surface of the second electrode 113; or, the patterned 114 may only cover a sidewall of the resistive layer 112.

Therefore, the passivation layer 114 can be formed on a desired position.

For example, the passivation material layer 1140 adopts a low-k material, which, for example, includes at least one of SiNx, SiCN, AlN, BN, and TaN. For example, a forming thickness of the passivation material layer 1140 may be 10 nm-100 nm, such as 20 nm, 30 nm, 50 nm, or 70 nm.

In addition, in other embodiments, an insulating layer 105 is formed on the passivation layer 114. In this case, the passivation layer 114 and the insulating layer 105 may be formed by the same patterning process to form the through hole exposing the second electrode 113.

Figure 5E:
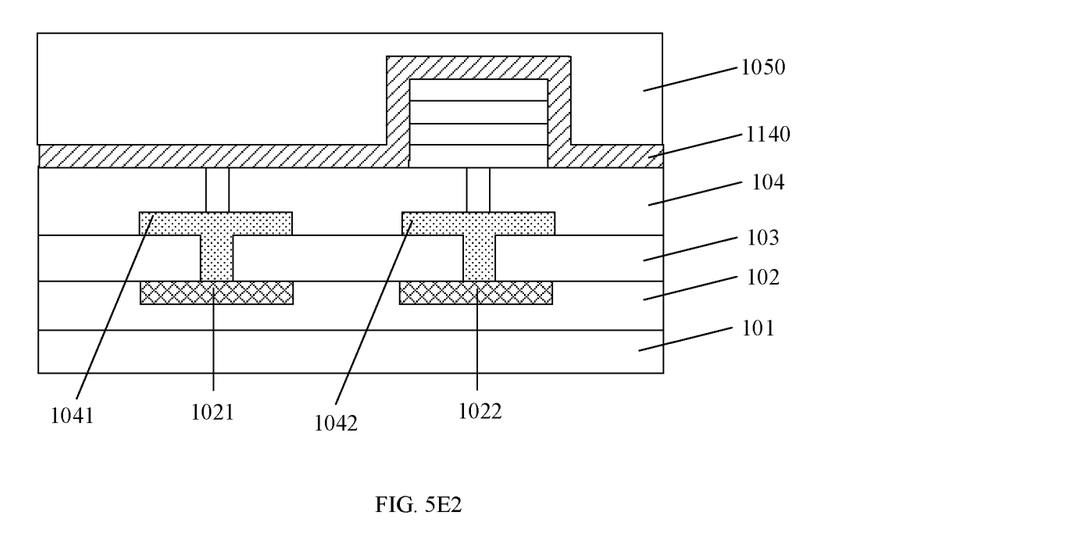
Figure 5F:
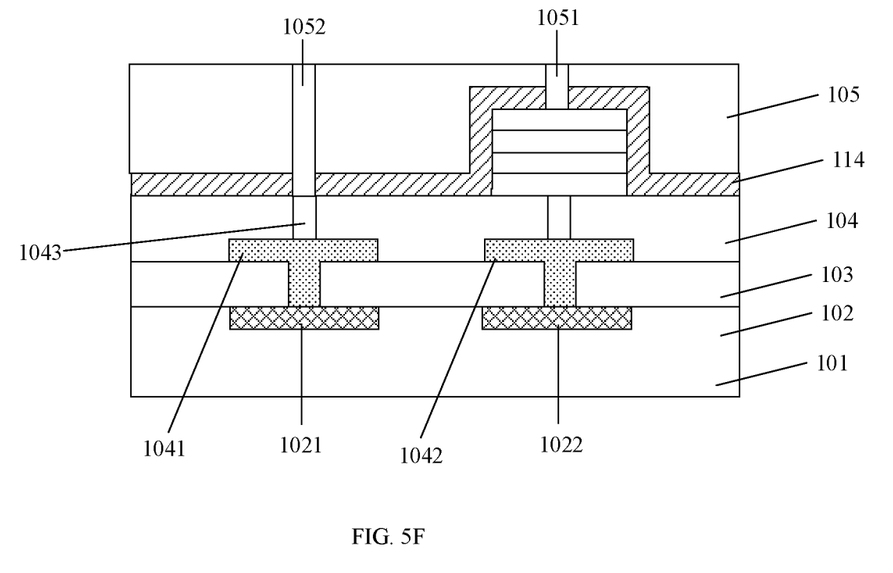

For example, as shown in FIG. 5E2, a passivation material layer 1140 and an insulating material layer 1050 are sequentially formed on a transistor on which the at least one memristive component is formed; for example, the insulating material layer 1050 may be formed by using a method such as sputtering (e.g., magnetron sputtering) or chemical vapor deposition (e.g., PECVD). Then, the passivation material layer 1140 and the insulating material layer 1150 are patterned to form the passivation layer 114 and the insulating layer 105, as shown in FIG. 5F. In this case, the passivation layer 114 and the insulating layer 105 have a first through hole 1051 exposing the second electrode and a through hole 1052 exposing the conductive structure 1043.

Next, the first through hole 1051 and the through hole 1052 are filled with, for example, a tungsten material to form a conductive structure.

For example, a forming thickness of the insulating material layer 1050 may be 100 nm-1000 nm, such as 300 nm, 500 nm, or 700 nm, so as to planarize and protect the at least one memristive unit 10. For example, the insulating material layer 1050 may include an insulating material such as silicon oxide ($SiO_2$).

For example, in some examples, after the insulating material layer 1050 is formed, the insulating material layer 1050 may be subjected to chemical mechanical polishing (CMP) to planarize a surface of the insulating material layer 1050. After the first through hole 1051 and the through hole 1052 are filled with a material such as tungsten to form a conductive structure, the surface of the conductive structure may also be planarized by chemical mechanical polishing to make the surface of the conductive structure align with the insulating layer 105.

Figure 5G:
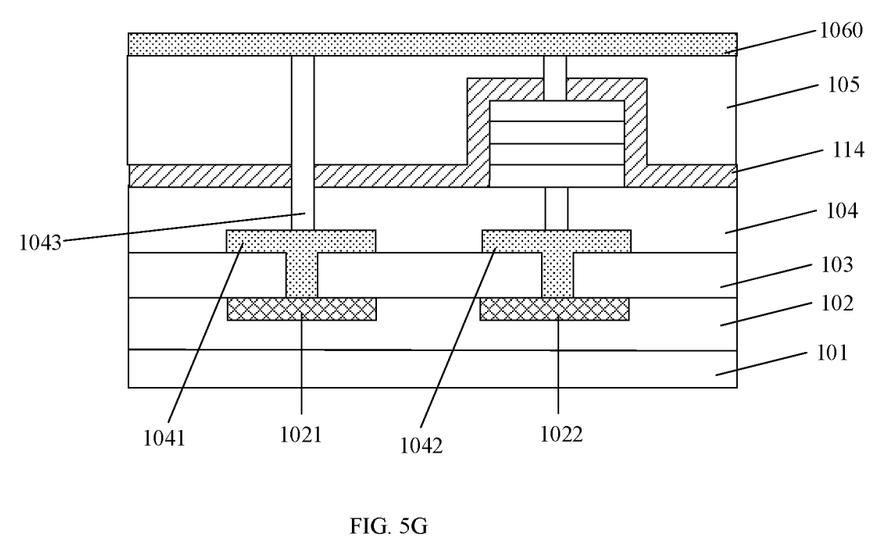
Figure 5H:
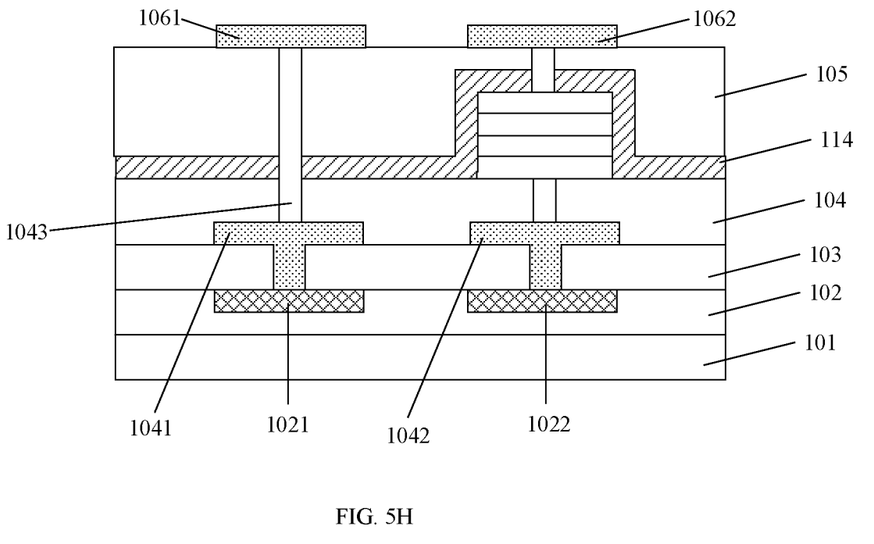

For example, as shown in FIG. 5G and FIG. 5H, the preparation method of the memristor further includes: forming a wiring layer on a side of the insulating layer 105 away from the at least one memristive unit, and forming the wiring layer includes: forming a wiring material layer 1060 on the side of the insulating layer 105 away from the at least one memristive unit by using a method such as physical vapor deposition or sputtering, as shown in FIG. 5G and then patterning the wiring material layer 1060 to form a wiring layer, as shown in FIG. 5H; the wiring layer includes a first wiring pattern 1061 and a second wiring pattern 1062; the first wiring pattern 1061 is electrically connected with the source electrode 1021 of the transistor through the conductive structure 1043 and the circuit pattern 1041, and the second wiring pattern 1062 is electrically connected with the second electrode 113 through the conductive structure formed in the first through hole 1051.

For example, a material of the wiring layer may be a metal material such as copper (Cu), aluminum (Al), silver (Al), or an alloy material thereof.

Figure 5I:
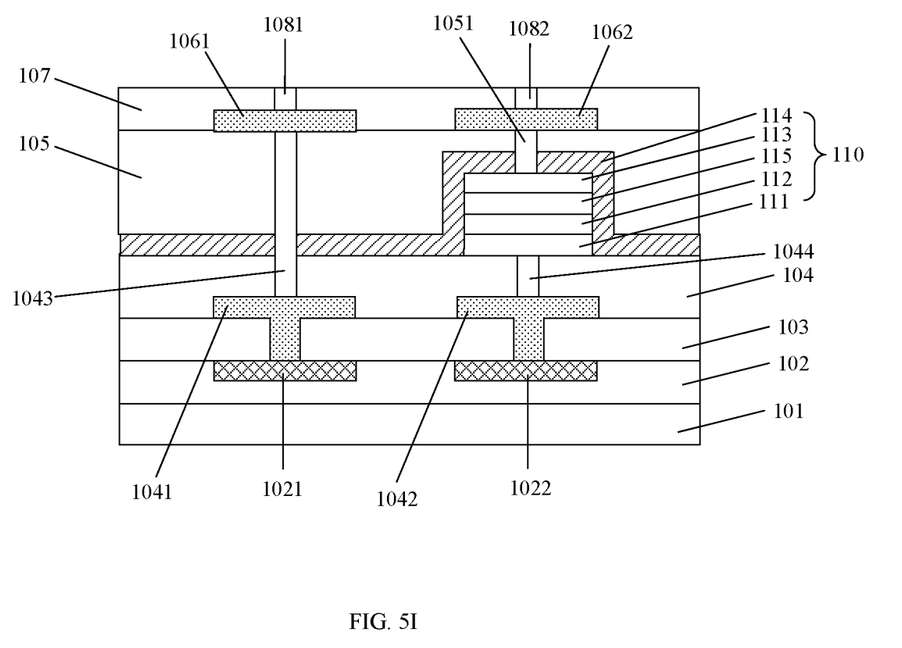

For example, as shown in FIG. 5I, the preparation method of the memristor further includes: forming a protective passivation layer 107 on a side of the wiring layer away from the insulating layer 105. Forming the protective passivation layer 107 includes: forming a protective passivation material layer on the side of the wiring layer away from the insulating layer 105 by using a method such as deposition or sputtering, and patterning the protective passivation material layer to form a protective passivation. In this case, the protective passivation layer has second via holes 1081 and 1082 exposing the wiring layer, to form interfaces.

For example, the second via holes 1081 and 1082 are subjected to surface treatment to form the interfaces for connecting an external circuit.

The above preparation method of the memristor can be compatible with the preparation process of the CMOS circuit, and the memristor prepared by using the above method can improve yield and performance stability of the memristor, and the prepared memristor can also use the passivation layer to separate the resistive layer from the adjacent insulating layer to avoid the problem of inter-diffusion of ions between the resistive layer and the insulating layer, and to prevent the heat generated by the memristive component during a resistive process from diffusing outwards. In addition, when the memristor includes a plurality of memristive units, the passivation layer can also avoid occurrence of crosstalk during operation of the memristive units to adversely affect overall performance of the memristor, such that the accuracy of the memristor is improved, and the memristor has long-term stability, and its performance will not degrade over time.

The following several statements should be noted:
(1) The accompanying drawings involve only the structure(s) in connection with the embodiment(s) of the present disclosure, and other structure(s) can be referred to common design(s).
(2) For clarity, in accompanying drawings for illustrating the embodiment(s) of the present disclosure, the thickness of a layer or a region may be enlarged or reduced, that is, the drawings are not drawn in an actual scale. It should understood that, in the case that a component such as a layer, film, region, substrate or the like is referred to be "on" or "under" another component, it may be directly on or under the another component or a component is interposed therebetween.
(3) In case of no conflict, embodiments of the present disclosure and the features in the embodiments may be mutually combined to obtain new embodiments.

The above descriptions are only specific embodiments of the present disclosure, but the protection scope of the present disclosure is not limited thereto, the protection scope of the present disclosure should be determined by the protection scope of the claims.

What is claimed is:

1. A memristor, comprising: at least one memristive unit, wherein each of the at least one memristive unit comprises:
   a transistor, comprising a source electrode and a drain electrode; and
   at least one memristive component, wherein each of the at least one memristive component comprises:
     a first electrode, electrically connected with the source electrode or the drain electrode;
     a second electrode;
     a resistive layer, provided between the first electrode and the second electrode; and
     a passivation layer, continuously covering on a sidewall of the resistive layer, a sidewall of the first electrode, a sidewall of the second electrode, a surface of the second electrode away from the first electrode and a surface, close to the first electrode, of an insulation layer between the transistor and the at least one memristive component;
   wherein a material of the passivation layer comprises at least one of SiNx, SiCN, AlN, and BN.

2. The memristor according to claim 1, wherein a dielectric constant of the passivation layer is k, and k≤10.

3. The memristor according to claim 1, wherein a thickness of the passivation layer ranges from 10 nm to 100 nm.

4. The memristor according to according to claim 1, wherein each of the at least one memristive component further comprises a capping layer,
   the capping layer is provided between the resistive layer and the second electrode, and a material of the capping layer comprises metal or metal oxide.

5. The memristor according to claim 4, wherein the metal comprises at least one of Ti, Hf, and Ta, and the metal oxide comprises at least one of TaOx, AlOx, and SiOx.

6. The memristor according to claim 1, further comprising an insulating layer,
   wherein the insulating layer covers the at least one memristive unit, and a thickness of the insulating layer ranges from 100 nm to 1000 nm.

7. The memristor according to claim 6, further comprising a wiring layer, wherein the wiring layer is provided on a side of the insulating layer away from the at least one memristive unit, the insulating layer has a first through hole exposing the second electrode, and the wiring layer is electrically connected with the second electrode through the first through hole.

8. The memristor according to claim 7, further comprising a protective passivation layer,
wherein the protective passivation layer is provided on a side of the wiring layer away from the insulating layer, and the protective passivation layer has a second through hole exposing the wiring layer to form an interface.

9. The memristor according to claim 1, wherein the at least one memristive unit comprises a plurality of memristive units, and the plurality of memristive units are arranged in an array.

10. The memristor according to claim 1, wherein a material of the first electrode comprises at least one of TiN, W, Pt and Pd, and a thickness of the first electrode ranges from 10 nm to 100 nm,
a material of the resistive layer comprises at least one of HfOx, TaOx and TiOx, and a thickness of the resistive layer ranges from 2 nm to 100 nm, and
a material of the second electrode comprises at least one of TiN, Ti, Al and W, and a thickness of the second electrode ranges from 10 nm to 100 nm.

11. A preparation method of a memristor, comprising:
forming at least one memristive unit, wherein each of the at least one memristive unit comprises:
a transistor, comprising a source electrode and a drain electrode; and
at least one memristive component, wherein forming each of the at least one memristive component comprises:
forming a first electrode, wherein the first electrode is electrically connected with the source electrode or the drain electrode;
forming a second electrode;
forming a resistive layer between the first electrode and the second electrode; and
forming a passivation layer, wherein the passivation layer is continuously formed on a sidewall of the resistive layer, a sidewall of the first electrode, a sidewall of the second electrode, a surface of the second electrode away from the first electrode and a surface, close to the first electrode, of an insulation layer between the transistor and the at least one memristive component;
wherein a material of the passivation layer comprises at least one of SiNx, SiCN, AlN, BN, and TaN.

12. The preparation method of a memristor according to claim 11, wherein forming at least one memristor component comprises:
sequentially forming a first electrode material layer, a resistive material layer and a second electrode material layer on the transistor;
patterning the first electrode material layer, the resistive material layer and the second electrode material layer to form the first electrode, the resistive layer and the second electrode of the at least one memristor component;
forming a passivation material layer on the transistor formed with the at least one memristor component; and
patterning the passivation material layer to form the passivation layer, wherein the passivation layer at least has a first through hole exposing the second electrode.

13. The preparation method of a memristor according to claim 11, further comprising forming an insulating layer, wherein the insulating layer covers the at least one memristive unit, wherein forming at least one memristor component comprises:
sequentially forming a first electrode material layer, a resistive material layer and a second electrode material layer on the transistor;
patterning the first electrode material layer, the resistive material layer and the second electrode material layer to form the first electrode, the resistive layer and the second electrode of the at least one memristor component;
forming a passivation material layer and an insulating material layer on the transistor formed with the at least one memristor component; and
patterning the passivation material layer and the insulating material layer to form the passivation layer and the insulating layer, wherein the passivation layer and the insulating layer have a first through hole exposing the second electrode.

14. The preparation method of a memristor according to claim 13, further comprising forming a wiring layer on a side of the insulating layer away from the at least one memristive unit, wherein forming the wiring layer comprises:
forming a wiring material layer on the side of the insulating layer away from the at least one memristive unit, and
patterning the wiring material layer to form the wiring layer, wherein the wiring layer is electrically connected with the second electrode through the first through hole.

15. The preparation method of a memristor according to claim 14, further comprising forming a protective passivation layer on a side of the wiring layer away from the insulating layer, wherein forming the protective passivation layer comprises:
forming a protective passivation material layer on the side of the wiring layer away from the insulating layer, and
patterning the protective passivation material layer to form the protective passivation layer, wherein the protective passivation layer has a second through hole exposing the wiring layer to form an interface.

* * * * *